(12) United States Patent
Dietrich et al.

(10) Patent No.: US 6,670,802 B2
(45) Date of Patent: Dec. 30, 2003

(54) INTEGRATED CIRCUIT HAVING A TEST OPERATING MODE AND METHOD FOR TESTING A MULTIPLICITY OF SUCH CIRCUITS

(75) Inventors: Stefan Dietrich, Türkenfeld (DE); Patrick Heyne, München (DE); Thilo Marx, Villingen-Schwenningen (DE); Sabine Kieser, Hausham (DE); Michael Sommer, München (DE); Thomas Hein, München (DE); Michael Markert, Augsburg (DE); Torsten Partsch, Chapel Hill, NC (US); Peter Schroegmeier, München (DE); Christian Weis, Germering (DE)

(73) Assignee: Infineon Technologies AG, Munich (DE)

( * ) Notice: Subject to any disclaimer, the term of this patent is extended or adjusted under 35 U.S.C. 154(b) by 72 days.

(21) Appl. No.: 10/033,131

(22) Filed: Oct. 22, 2001

(65) Prior Publication Data

US 2002/0133750 A1 Sep. 19, 2002

(30) Foreign Application Priority Data

Oct. 20, 2000 (DE) .......................... 100 52 211

(51) Int. Cl.[7] .................... G01R 31/02; G01R 31/28
(52) U.S. Cl. .................... 324/158.1; 714/733; 324/763
(58) Field of Search ............... 324/158.1, 765; 714/718, 724, 726, 727, 733, 734, 738, 741, 742; 365/201

(56) References Cited

U.S. PATENT DOCUMENTS

| | | | | |
|---|---|---|---|---|
| 4,490,783 A | * | 12/1984 | McDonough et al. | ....... 712/227 |
| 4,594,711 A | * | 6/1986 | Thatte | ......................... 714/728 |
| 4,672,610 A | * | 6/1987 | Salick | .......................... 714/742 |
| 4,893,311 A | * | 1/1990 | Hunter et al. | ................ 714/733 |
| 4,970,727 A | * | 11/1990 | Miyawaki et al. | ........... 714/720 |
| 5,301,156 A | * | 4/1994 | Talley | ........................... 365/201 |
| 5,361,264 A | * | 11/1994 | Lewis | ........................... 714/733 |
| 5,546,406 A | * | 8/1996 | Gillenwater et al. | ......... 714/733 |
| 5,964,894 A | | 10/1999 | Kurihara | ....................... 714/738 |

FOREIGN PATENT DOCUMENTS

DE     199 37 320 A1     2/2000

OTHER PUBLICATIONS

JEDEC Solid State Technology Association: "Double Data Rate (DDR) SDRAM Specification", JEDEC Standard No. 79, Arlington, Jun. 2000, pp. i, 1–15.

* cited by examiner

*Primary Examiner*—Kamand Cuneo
*Assistant Examiner*—Russell M. Kobert
(74) *Attorney, Agent, or Firm*—Laurence A. Greenberg; Werner H. Stemer; Ralph E. Locher

(57) ABSTRACT

Integrated circuits, in particular memory chips of the DDR SDRAM type, are tested in a parallel manner. In order to prevent the circuits from being driven relative to one another during a test operation, an input terminal that is already connected to a channel of an automatic test machine anyway is connected to a switching device, by which the output drivers can be turned off in a manner dependent on the control signal that can be fed in at the input terminal. The switching device preferably contains a demultiplexer and also a multiplexer. The demultiplexer can be driven by a test control signal that is additionally generated besides the test control signal. The input terminal is connected to a tester channel anyway during test operation, with the result that no additional external outlay arises.

7 Claims, 1 Drawing Sheet

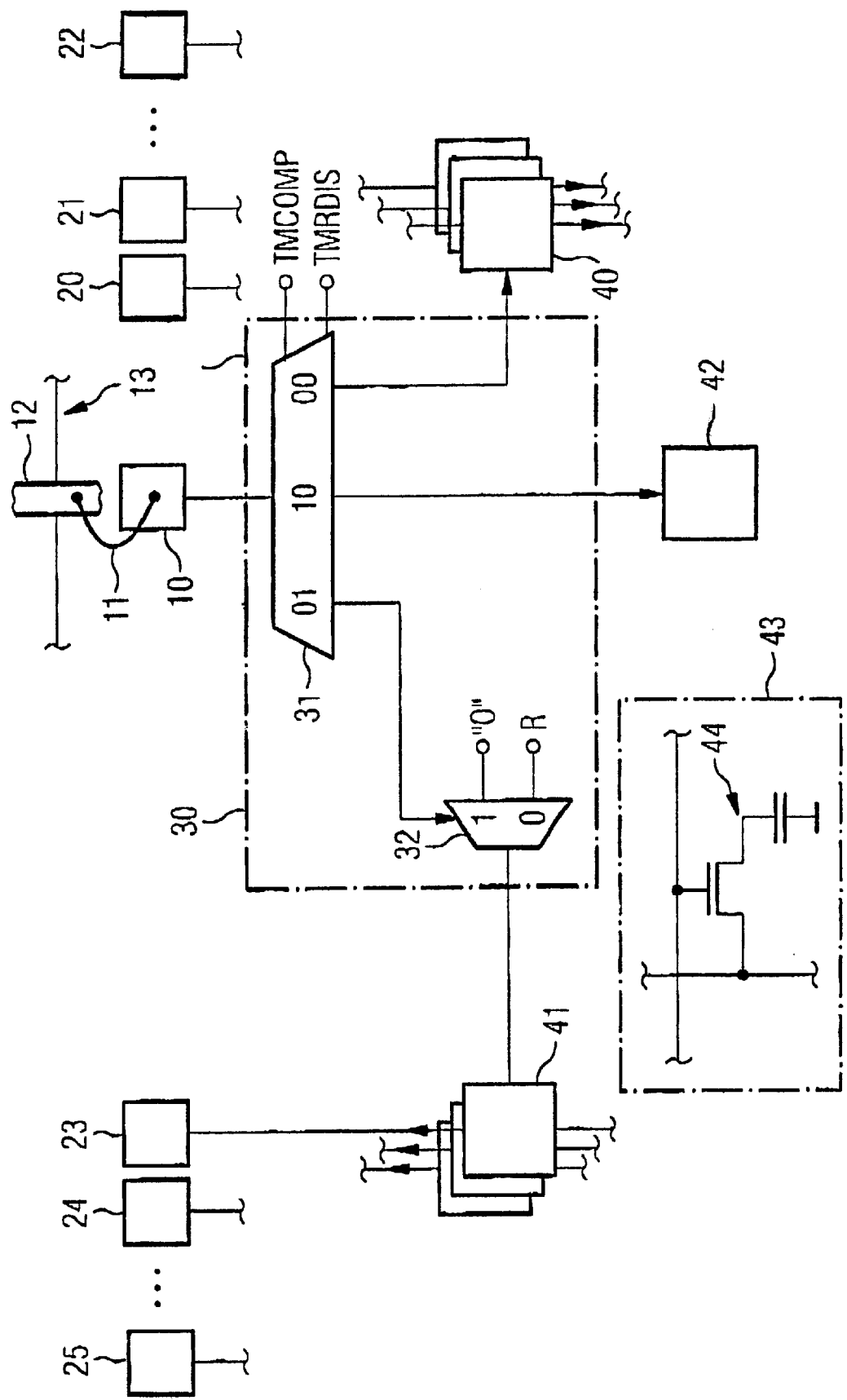

INTEGRATED CIRCUIT HAVING A TEST OPERATING MODE AND METHOD FOR TESTING A MULTIPLICITY OF SUCH CIRCUITS

BACKGROUND OF THE INVENTION

Field of the Invention

The invention relates to an integrated circuit that can be operated in a normal operating mode and in a test operating mode. A control signal for controlling a switching device is fed in via an input terminal. The invention additionally relates to a method for testing a multiplicity of such integrated circuits connected in parallel on the output side.

Integrated circuits, in particular semiconductor memories, are tested after fabrication in order to ensure their functionality. For this purpose, the memory chips are put into a test mode by an automatic test machine. A multiplicity of memory chips are driven and tested in parallel. The memory chips are connected in parallel on the output side. Care must be taken to ensure that during the read-out of the test result, two chips do not, for instance, simultaneously output a signal to the tester via the common terminal. Therefore, for this case, only one of the memory chips is to be activated for outputting a test result to the automatic test machine, and the rest of the memory chips are to be deactivated during this period of time of outputting a test result to the automatic test machine.

Memories that are in demand nowadays are, in particular semiconductor memories having a synchronous operating mode, so-called synchronous dynamic random access memories (SDRAMs). There are DDR SDRAMs, so-called double data rate SDRAMs, which process information on the rising and falling edges of the clock signal which controls the synchronous operating mode. There is limited freedom in the circuitry implementation of concepts for SDRAMs and DDR SDRAMs since the outwardly directed functionality of these semiconductor memories have to satisfy different standards, standardized e.g. by JEDEC.

The document JEDEC Solid State Technology Association: Double Data Rate (DDR) SDRAM Specification, JEDEC Standard No. 79, Arlington, June 2000, pages i; 1 to 15, describes a semiconductor memory in which, during normal operation, in a manner dependent on a control signal DM that can be fed in on the input side, a data input signal path can be switched on and off in the event of a write access. The data present at the data bus terminals DQ0 to DQ7 are written to the memory in the case of a low level of the control signal DM and are masked out in the case of a high level. The semiconductor memory otherwise contains data output drivers and a data input signal path. A mode register can be used to change over between the normal operation and a manufacturer-specific test mode.

Published, Non-Prosecuted German Patent Application DE 199 37 320 A1 describes a semiconductor memory in which a test signal DQM is fed in via an external terminal. A read enable signal PSE is generated in a manner dependent thereon during test operation. An internal read enable control signal is generated during normal operation.

SUMMARY OF THE INVENTION

It is accordingly an object of the invention to provide an integrated circuit having a test operating mode and a method for testing a multiplicity of such circuits which overcome the above-mentioned disadvantages of the prior art devices and methods of this general type, which conform to standards and can be tested with little external outlay.

With the foregoing and other objects in view there is provided, in accordance with the invention, an integrated circuit containing a functional unit. The integrated circuit has a first operating mode functioning as a test operating mode for functionally testing the functional unit, and a second operating mode for operating the functional unit in a normal operating mode. A data output driver and a data input signal path are coupled to the functional unit. Data terminals for data signals for feeding in and picking off data values are provided. The data terminals are coupled to the data output driver and to the data input signal path. An input terminal is provided for feeding in a control signal. A control circuit is coupled to the input terminal, to the data output driver, and to the data input signal path. In a manner dependent on a set operating mode, the control circuit during the normal operating mode switches the data input signal path on or off as a result of different states of the control signal, and in the test operating mode, the control circuit switches the data output driver on or off as a result of the different states of the control signal.

DDR SDRAMs, in particular, have the above-mentioned input terminal for feeding in a control signal anyway. The terminal is called the DM pad according to the JEDEC standard. During normal operation of the memory chip, it allows byte-by-byte masking of the data in the writing direction. Therefore, when the control signal present at the DM pad has a predetermined state, e.g. a high level, the data byte that can be influenced by the DM pad is blocked and not received internally by the memory chip. What is made possible by the measures provided by the invention, in a simple manner with little circuitry outlay, is that the parallel driving of test results is prevented during the test operation.

Thus, provision is made of a demultiplexer that is connected to the DM pad on the input side. On the output side, the demultiplexer is used, during normal operation, to forward the normal functionality of the control signal input at the DM pad to the remaining functional units in the memory chip. Thus, during normal operation, the data input signal paths can be masked, i.e. turned off, by the control signal input at the DM pad. During test operation, the demultiplexer controls, on the output side, the changeover control input of a multiplexer. The latter has the effect that, depending on the signal input at the DM pad, either a constant level value is forwarded or a control signal that is generated in another way and controls the read operation within the memory chip. The output of the multiplexer drives one of the data output drivers of the memory chip. If the demultiplexer is changed over to the last-mentioned output during test operation, the multiplexer is optionally changed over to the constant level or the reading control signal depending on the signal input at the DM pad. The data output driver is turned off in the first case and it can be triggered depending on the reading control signal in the second case.

What is made possible, then, overall is that, by the control signal being impressed externally at the DM pad, by the automatic test machine, the data output driver of a data signal terminal can be turned on or off on-chip. This consequently allows the automatic test machine to activate this one or a plurality of the data signal outputs of a single memory chip, and to interrogate test output data. The situation in which a plurality of memory chips drive in parallel and their output signals thereby become unreadable is avoided. The particular advantage of the invention is that little additional outlay is required on-chip as well as on the part of the automatic test machine. The DM pad is connected to a channel of the automatic test machine anyway, for other reasons. Therefore, the tester channels that are required as standard do not have to be supplemented by channels for driving any pads of the chip to be tested. As a result, a multiplicity of DDR SDRAMs can be controlled in parallel, which keeps the utilization factor of the automatic test machine and ultimately the test costs comparatively low.

The different operating-mode states of the semiconductor chip are communicated to the memory chip via the address inputs. During normal operation, the addresses for selection of one or more of the memory cells of the memory chip are input at the address inputs. Furthermore, the address inputs serve for inputting control signals that contain a specific sequence of data bits usually within particular time windows that are not permissible during normal operation. Accordingly, the memory chip is first changed over from the preset normal operating mode to the test operating mode, called TMCOMP. During the TMCOMP mode, information about the defect state of specific areas of the memory cell array is determined for example by a test that proceeds internally in a largely autonomous manner (built-in self-test). This information subsequently has to be output to the tester in order that the latter controls the replacement of defective memory cells or circuit blocks by corresponding redundant elements. According to the invention, a further test mode is generated. The latter is again set by a predetermined command sequence that is input via the address inputs of the memory chip, so-called TMRDIS mode. The control signal indicating the TMRDIS mode controls the first multiplexer and changes it over from normal operation or, alternatively, the TMCOMP operation to the TMRDIS operation, with the result that a transparent signal path is connected from the DM pad to the control input of the multiplexer. Afterward, a changeover is made from the TMRDIS mode back to the TMCOMP mode through a corresponding command inputting via the address terminals.

The DM pad is a terminal pad which is to be provided in a DDR SDRAM according to the JEDEC standard and is usually to be contact-connected via a bonding wire to a terminal pin of the housing. Consequently, the DM pad can be driven externally directly via a housing pin. The number of data signals that can be masked by the DM pad during a writing process in the normal operation is eight bits, a so-called byte. The signals driving the multiplexer have a low level for the constant level value. The reading operating mode signal has a low level during a write operation and a high level for activating a read operation. A turned-off output driver is in a tristate mode, i.e. at high impedance.

In accordance with an added feature of the invention, the functional unit has memory cells. Address terminals are provided for receiving address signals and for feeding the address signals to the memory cells, and one of the control signals (i.e. a second control signal) is fed in via the address terminals.

In accordance with another feature of the invention, the constant signal level is a low level.

In accordance with a further feature of the invention, the data values for the memory cells of the functional unit are fed in and picked off at the data terminals. A respective one of the data output drivers and a respective one of the data input signal paths are coupled to one of the data terminals, and the data output drivers are connected to and driven simultaneously by the output of the multiplexer. The data input signal paths are connected to and driven simultaneously by one of the outputs of the demultiplexer.

In accordance with an additional feature of the invention, the number of the data terminals is exactly eight for forming a byte.

With the foregoing and other objects in view there is provided, in accordance with the invention, a method for testing a circuit. The method includes providing a multiplicity of integrated circuits. Each of the integrated circuits includes a functional unit, and having a first operating mode functioning as a test operating mode for functionally testing the functional unit, and a second operating mode for operating the functional unit in a normal operating mode. A data output driver and a data input signal path are coupled to the functional unit. Terminals are provided for data signals for feeding in and picking off data values. The terminals are coupled to the data output driver and to the data input signal path. An input terminal for feeding in a control signal is provided and a control circuit is coupled to the input terminal, to the data output driver, and to the data input signal path. In a manner dependent on a set operating mode, the control circuit in the normal operating mode switches the data input signal path on or off as a result of different states of the control signal, and in the test operating mode, the control circuit switches the data output driver on or off as a result of the different states of the control signal. The terminals of the integrated circuits are connected in parallel, and in each case only one of the control signals that are in each case fed separately to the individual input terminals of the integrated circuits assumes a first state, and a remainder of the control signals all jointly assume another state.

Other features which are considered as characteristic for the invention are set forth in the appended claims.

Although the invention is illustrated and described herein as embodied in an integrated circuit having a test operating mode and a method for testing a multiplicity of such circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a block circuit diagram of a detail of a DDR SDRAM according the invention.

DESCRIPTION OF THE PREFERRED EMBODIMENTS

Referring now to the single FIGURE of the drawing in detail, there is shown a part of a DDR SDRAM having a DM pad 10, a number of address pads 20, 21, 22 and also a number of data input/output pads 23, 24, 25. The number of address pads depends on the quantity of individually addressable memory cells. The number of data input/output pads may be, for example, 32 bits, that is to say 4 bytes. The DM pad 10 is connected via a bonding wire 11 to a terminal pin 12 of a housing 13. Internally within the circuit, the DM pad 10 is connected to a control circuit 30. The control circuit 30 has the effect that an input signal path 40 assigned to a respective one of the data pads 23, 24, 25 can be masked in a normal mode, while a data output driver 41 connected to the data terminals 23, 24, 25 can be turned off during a test operation.

In detail, the control circuit 30 has a demultiplexer 31. On an input side, the demultiplexer 31 is connected to the DM pad 10. On a control signal side, the two control signals TMCOMP and TMRDIS are fed to the demultiplexer 31. The signal TMCOMP specifies that a test operation is present, and the signal TMRDIS specifies that a particular further mode is switched on during the test operation. A first output 00 of the demultiplexer 31 is enabled during normal operation and drives the data input signal paths 40 connected to the data signal pads 23, 24, 25. Depending on a signal state of the signal fed in at the DM pad 10, the data input signal paths 40 that are driven in parallel byte by byte can be masked, i.e. turned off. A second output 10 of the demultiplexer 31 is activated in the TMCOMP mode. Functional units assigned to the operating mode are represented by reference numeral 42 and have the effect that memory cells 44 in a memory cell array 43 are tested with regard to functionality. The test result of the circuits 42 performing a built-in self-test is forwarded, at the end of the test, via the data output driver 41 to the data signal pads 23, 24, 25. An output 01 of the demultiplexer 31 is enabled in the operating mode TMRDIS. The output is connected to a control input of a multiplexer 32. Depending on the control signal present at the DM pad 10, the multiplexer 32 is operated either in its position 1 or in its position 0. In the case of position 1, a constant level, e.g. "0", is forwarded, which drives the output drivers 41 connected to the data signal pads 23, 24, 25. In the position 0, a signal R that controls the reading operating mode is advanced to the output of the multiplexer 32. In the position 1, the output drivers 41 are turned off and, in the position 0, they are switched on or off depending on the state of the signal R. In each case one byte, i.e. a number of eight data input signal paths 40 and data output drivers 41 can be driven simultaneously by the output 00 of the demultiplexer 31 and, respectively, by the output of the multiplexer 32.

The signals TMCOMP and TMRDIS are generated on-chip after a suitable command sequence has been input via the address pads 20, 21, 22. The test operating mode indicated by the control signal TMCOMP is conventionally present in a DDR SDRAM. The operating mode TMRDIS and the control signal TMCOMP indicating this operating mode have been newly introduced in connection with the invention. Through activation of the test operating mode TMRDIS, a signal path is connected from the DM pad 10 to the control terminal of the multiplexer 32, with the result that the control signal fed in from the automatic test machine via the terminal pin 12 and the DM pad 10 can control the multiplexer 32 optionally into position 1 or into position 0, with the result that the output drivers 41 combined in a byte-by-byte manner are then either reliably turned off, in position 1, or are enabled in accordance with the reading control signal R, in position 0.

With the introduction of the additional test mode TMRDIS, it is possible for the DM pad 10 to be allocated an additional functionality during test operation. As a result of suitable signal impression of the control signal present at the DM pad 10, by the automatic test machine, it becomes possible for the output drivers 41 to be enabled. Usually, a multiplicity of identical memory chips are tested in parallel. The output pads 23, 24, 25 of these different memory chips to be tested are wired in parallel to corresponding tester channels. According to the JEDEC standard, the DM pad 10 is assigned a dedicated tester channel anyway. By virtue of the fact that during the TMRDIS mode, which is input to the chip by the automatic test machine, in each case only one of the DM pads is driven with a high level and, consequently, the multiplexer 32 of only one of the multiplicity of memory chips connected in parallel is brought to position 1, it is ensured that only a byte-by-byte set of the output drivers 41 is enabled in order that the test output signal generated in the TMCOMP mode is output via the data pads 23, 24, 25. For the outputting of these test results of the TMCOMP mode from different memory chips to the automatic test machine, only the DM pad of one of the memory chips tested in parallel has a high level applied to it in a successively alternating manner. In interaction, it emerges that the memory chips wired in parallel on the output side are not driven relative to one another when outputting a test result.

Since the DM pad 10 is connected to a separate channel of the automatic test machine anyway, an additional wiring outlay is not necessary on the part of the automatic test machine. The circuitry outlay within the memory chip is relatively low, as can clearly be seen from the FIGURE. What is made possible by the allocation of the additional functionality described above to the DM pad that is present anyway is that the largest possible multiplicity of memory chips can be tested in parallel.

We claim:

1. An integrated circuit, comprising:
    a functional unit, the integrated circuit having a first operating mode functioning as a test operating mode for functionally testing said functional unit, and a second operating mode for operating said functional unit in a normal operating mode;
    a data output driver coupled to said functional unit;
    a data input signal path coupled to said functional unit;
    data terminals for data signals for feeding in and picking off data values, said data terminals coupled to said data output driver and to said data input signal path;
    an input terminal for feeding in a control signal; and
    a control circuit coupled to said input terminal, to said data output driver, and to said data input signal path and, in a manner dependent on a set operating mode, said control circuit during the normal operating mode switches said data input signal path on or off as a result of different states of the control signal, and in the test operating mode, said control circuit switches said data output driver on or off as a result of the different states of the control signal, said control circuit containing a multiplexer and a demultiplexer, said demultiplexer having inputs connected to said input terminal and receiving and being controlled by a second control signal, said demultiplexer having outputs and one of said outputs of said demultiplexer being connected to and controlling said multiplexer, said multiplexer having inputs receiving a constant signal level and a third control signal for setting a read operating mode, said multiplexer having an output connected to said data output driver and outputs an output signal for switching on or off said data output driver.

2. The integrated circuit according to claim 1, including a housing pin and said input terminal is a terminal pad contact-connected to said housing pin.

3. The integrated circuit according to claim 1, wherein said functional unit has memory cells; and including address terminals for receiving address signals and for feeding the address signals to said memory cells, and the second control signal is fed in via said address terminals.

4. The integrated circuit according to claim 3, wherein data values for said memory cells of said functional unit are fed in and picked off at said data terminals, a respective one of said data output drivers and a respective one of said data input signal paths are coupled to one of said data terminals, and said data output drivers are connected to and driven simultaneously by said output of said multiplexer, and said data input signal paths are connected to and driven simultaneously by one of said outputs of said demultiplexer.

5. The integrated circuit according to claim 4, wherein a number of said data terminals is exactly eight for forming a byte.

6. The integrated circuit according to claim 1, wherein the constant signal level is a low level.

7. A method for testing a circuit, which comprises the steps of:

provding a multiplicity of integrated circuits, each of the integrated circuits including:

a functional unit, and having a first operating mode functioning as a test operating mode for functionally testing the functional unit, and a second operating made for operating the functional unit in a normal operating mode;

a data output driver coupled to the functional unit;

a data input signal path coupled to the functional unit;

terminals for data signals for feeding in and picking off data values, the terminals coupled to the data output driver and to the data input signal path;

an input terminal for feeding in a control signal; and a control circuit coupled to the input terminal, to the data output driver, and to the data input signal path and, in a manner dependent on a set operating mode, the control circuit in the normal operating mode switching the data input signal path on or off as a result of different states of the control signal, and in the test operating mode, the control circuit switching the data output driver on or off as a result of the different states of the control signal; and connecting the terminals of the integrated circuits in parallel, and in each case only one of the control signals that are in each case fed separately to the input terminal of the integrated circuits assumes a first state, and a remainder of the control signals all jointly assume another state.

* * * * *